US009059285B2

(12) United States Patent
Chan et al.

(10) Patent No.: US 9,059,285 B2
(45) Date of Patent: Jun. 16, 2015

(54) STRUCTURE AND METHOD FOR INCREASING STRAIN IN A DEVICE

(71) Applicant: International Business Machines Corporation, Armonk, NY (US)

(72) Inventors: Kevin K. Chan, Staten Island, NY (US); Abhishek Dube, Belmont, CA (US); Viorel C. Ontalus, Danbury, CT (US)

(73) Assignee: International Business Machines Corporation, Armonk, NY (US)

( * ) Notice: Subject to any disclaimer, the term of this patent is extended or adjusted under 35 U.S.C. 154(b) by 106 days.

(21) Appl. No.: 13/771,864

(22) Filed: Feb. 20, 2013

(65) Prior Publication Data

US 2013/0161649 A1    Jun. 27, 2013

Related U.S. Application Data

(62) Division of application No. 12/886,903, filed on Sep. 21, 2010, now Pat. No. 8,551,845.

(51) Int. Cl.
| | |
|---|---|
| *H01L 29/78* | (2006.01) |
| *H01L 21/265* | (2006.01) |
| *H01L 29/165* | (2006.01) |
| *H01L 29/66* | (2006.01) |

(52) U.S. Cl.
CPC ...... *H01L 29/7847* (2013.01); *H01L 21/26506* (2013.01); *H01L 21/26566* (2013.01); *H01L 21/26593* (2013.01); *H01L 29/165* (2013.01); *H01L 29/66636* (2013.01); *H01L 29/78* (2013.01); *H01L 29/7848* (2013.01)

(58) Field of Classification Search
CPC ............ H01L 29/7847; H01L 29/7848; H01L 29/66636; H01L 29/165; H01L 29/78
See application file for complete search history.

(56) References Cited

U.S. PATENT DOCUMENTS

| | | | |
|---|---|---|---|
| 4,597,824 | A | 7/1986 | Shinada et al. |
| 6,969,875 | B2 | 11/2005 | Fitzgerald |
| 7,198,995 | B2 | 4/2007 | Chidambarao et al. |
| 7,341,902 | B2 | 3/2008 | Anderson et al. |
| 7,384,829 | B2 | 6/2008 | Cheng et al. |
| 7,402,872 | B2 | 7/2008 | Murthy et al. |
| 7,438,760 | B2 | 10/2008 | Bauer et al. |
| 7,473,608 | B2 | 1/2009 | Li et al. |
| 7,488,670 | B2 | 2/2009 | Knoefler et al. |
| 7,538,387 | B2 | 5/2009 | Tsai |

(Continued)

OTHER PUBLICATIONS

J. W. Strane et al., "Carbon incorporation into Si at high concentrations by ion implantation and solid phase epitaxy," J. Appl. Phys. vol. 79, 1996, pp. 637-646.

(Continued)

*Primary Examiner* — Jarrett Stark
(74) *Attorney, Agent, or Firm* — Yuanmin Cai; Hoffman Warnick LLC

(57) ABSTRACT

A method and structure are disclosed for increasing strain in a device, specifically an n-type field effect transistor (NFET) complementary metal-oxide-semiconductor (CMOS) device. Embodiments of this invention include an n-type field effect transistor (NFET) complementary metal-oxide-semiconductor (CMOS) device having a source region and a drain region, the NFET CMOS including: an n-type doped layer in at least one of the source region and the drain region, wherein the n-type doped layer includes substitutional carbon and has a memorized tensile stress induced by a stress memorization technique (SMT).

10 Claims, 17 Drawing Sheets

(56) References Cited

U.S. PATENT DOCUMENTS

| | | |
|---|---|---|
| 7,582,547 B2 | 9/2009 | Pawlak |
| 7,666,771 B2 | 2/2010 | Krull et al. |
| 7,678,637 B2 | 3/2010 | Nandakumar et al. |
| 7,767,534 B2 | 8/2010 | Yang et al. |
| 7,932,144 B2 | 4/2011 | Liu et al. |
| 7,960,236 B2 * | 6/2011 | Chopra et al. ............ 438/300 |
| 2007/0148888 A1 | 6/2007 | Krull et al. |
| 2007/0252144 A1 | 11/2007 | Peidous et al. |
| 2007/0254461 A1 | 11/2007 | Wei et al. |
| 2008/0006818 A1 * | 1/2008 | Luo et al. ............ 257/19 |
| 2008/0182075 A1 * | 7/2008 | Chopra et al. ............ 428/172 |
| 2008/0280391 A1 | 11/2008 | Shin et al. |
| 2009/0001371 A1 | 1/2009 | Mowry et al. |
| 2009/0286367 A1 | 11/2009 | Krull et al. |
| 2010/0112766 A1 | 5/2010 | Liu et al. |
| 2011/0306193 A1 | 12/2011 | Krull et al. |

OTHER PUBLICATIONS

C. Ortolland et al., "Stress Memorization Technique (SMT) Optimization for 45nm CMOS," 2006 Symposium on VLSI Technology Digest of Technical Papers, pp. 78-79.

N. G. Rudawski et al., "Amorphization and Solid-Phase Epitaxial Growth of C-Cluster," Journal of Electronic Materials, vol. 38, No. 9, 2009, pp. 1926-1930.

C.-H. Chen et al., "Stress Memorization Technique (SMT) by Selectively Strained-Nitride Capping for Sub-65nm High-Performance Strained-Si Device Application," 2004 Symposium on VLSI Technology Digest of Technical Papers, pp. 56-57.

U.S. Appl. No. 12/886,903, filed Sep. 21, 2010, Office Action dated Jan. 29, 2013.

U.S. Appl. No. 12/886,903, Notice of Allowances and Fees Due dated Jun. 3, 2013.

* cited by examiner

STRUCTURE AND METHOD FOR INCREASING STRAIN IN A DEVICE

CROSS-REFERENCE TO RELATED APPLICATIONS

This application is a continuation of U.S. patent application Ser. No. 12/886,903, currently pending and incorporated by reference herein in its entirety.

BACKGROUND

The subject matter disclosed herein relates to integrated circuit chips, and more specifically, to a structure and method for channel electron mobility enhancement by increasing strain in a device.

Currently, methods to improve n-type field effect transistor (NFET) complementary metal-oxide-semiconductor (CMOS) performance include stress engineering, namely a tensile strain via building in a source/drain (S/D) stressor material, e.g., carbon. Substitutional carbon induces a tensile stress that improves electron mobility in a channel of the NFET. Recent technological developments have made possible the growth of epitaxial silicon with substitutional carbon and doped with phosphorus. However, the limitations of the state of the art epitaxy include the inability to grow high concentrations of substitutional carbon and phosphorus at the same time because the two elements are competing for substitutionality.

Another limitation of an epitaxial only S/D based silicon carbon phosphorous (SiCP) system is the fact that this film can not be implanted as is, due to the displacement of the carbon atoms from substitutional positions, which leads to stress loss. The inability to implant into this film impedes resistance optimization via a higher n-type doping implant. Yet, another limitation of the epitaxial only S/D based SiCP system is the fact that this system is not compatible with the stress memorization technique (SMT), which relies on the presence of an amorphous material encapsulated with a film, preferably a tensile nitride. SMT causes a "memorization" of stress due to an expansion of silicon-based amorphous material during an anneal while encapsulated by a nitride. However, in prior art methods, the presence of substitutional carbon is not compatible with a subsequent amorphization to enable a SMT process because the amorphization will irreversibly dislocate substitutional carbon from the lattice. Incorporating carbon into substitutional sites via solid phase epitaxy (SPE) implies implants post SMT, which results in the loss of the SMT effect. In other words, the state of the art stress engineering methodology does not allow the simultaneous incorporation of substitutional carbon and a stress memorization technique.

SUMMARY

A method and structure are disclosed for increasing strain in a device, specifically an n-type field effect transistor (NFET) complementary metal-oxide-semiconductor (CMOS) device. Embodiments of this invention include growing an epitaxial layer, performing a cold carbon or cluster carbon pre-amorphization implantation to implant substitutional carbon into the epitaxial layer, forming a tensile cap over the epitaxial layer, and then annealing to recrystallize the amorphous layer to create a stress memorization technique (SMT) effect. The epitaxial layer will therefore include substitutional carbon and have a memorized tensile stress induced by the SMT. Embodiments of this invention can also include a lower epitaxial layer under the epitaxial layer, the lower epitaxial layer comprising for example, a silicon carbon phosphorous (SiCP) layer.

A first aspect of the disclosure provides a method to enhance channel conduction by increasing strain in a device having a source region and a drain region, the method including: forming a recess in at least one of the source region and the drain region; growing an epitaxial layer within the recess, wherein the epitaxial layer includes an n-type dopant; performing a pre-amorphization implant (PAI) to form an amorphous layer in at least a portion of the epitaxial layer, wherein the pre-amorphization implant comprises one of: a cold carbon implant and a cluster carbon implant; forming a tensile cap over the amorphous layer to enable a stress memorization technique (SMT); and crystallizing the amorphous layer by annealing after forming the tensile cap to create an SMT effect.

A second aspect of the disclosure provides an n-type field effect transistor (NFET) complementary metal-oxide-semiconductor (CMOS) device having a source region and a drain region, the NFET CMOS including: an n-type doped layer in at least one of the source region and the drain region, wherein the n-type doped layer includes substitutional carbon and has a memorized tensile stress induced by a stress memorization technique (SMT).

A third aspect of the disclosure includes an n-type field effect transistor (NFET) complementary metal-oxide-semiconductor (CMOS) device having a source region and a drain region, the NFET CMOS including: an n-type doped layer in at least one of the source region and the drain region, wherein the n-type doped layer includes substitutional carbon and has a memorized tensile stress induced by a stress memorization technique (SMT); an implantation layer within the n-type doped layer, wherein the implantation layer comprises silicon carbon phosphorous (SiCP) with an additional n-type dopant; and a lower n-type doped layer, positioned under the n-typed doped layer, wherein the lower n-type doped layer comprises crystalline silicon carbon phosphorous (SiCP).

A fourth aspect of the disclosure includes an n-type field effect transistor (NFET) complementary metal-oxide-semiconductor (CMOS) device having a source region and a drain region, the NFET CMOS including: an n-type doped layer in at least one of the source region and the drain region, wherein the n-type doped layer includes substitutional carbon and has a memorized tensile stress induced by a stress memorization technique (SMT); an implantation layer within the n-type doped layer, wherein the implantation layer comprises silicon carbon phosphorous (SiCP) with an additional n-type dopant, wherein the additional n-type dopant comprises a dopant selected from the group consisting of: phosphorus (P), antimony (Sb) and arsenic (As); and a lower n-type doped layer, positioned under the n-typed doped layer, wherein the lower n-type doped layer comprises crystalline silicon carbon phosphorous (SiCP), wherein the lower n-type doped layer and the n-type doped layer are separated by an intermediate layer, wherein the intermediate layer comprises n-type doped silicon (Si).

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

Embodiments of this invention provide a method and structure to enhance channel resistance by increasing strain in a device. A method according to one embodiment of this invention is shown in FIGS. 1-8, with FIG. 9 showing the final device structure according to this embodiment.

Figure 1:
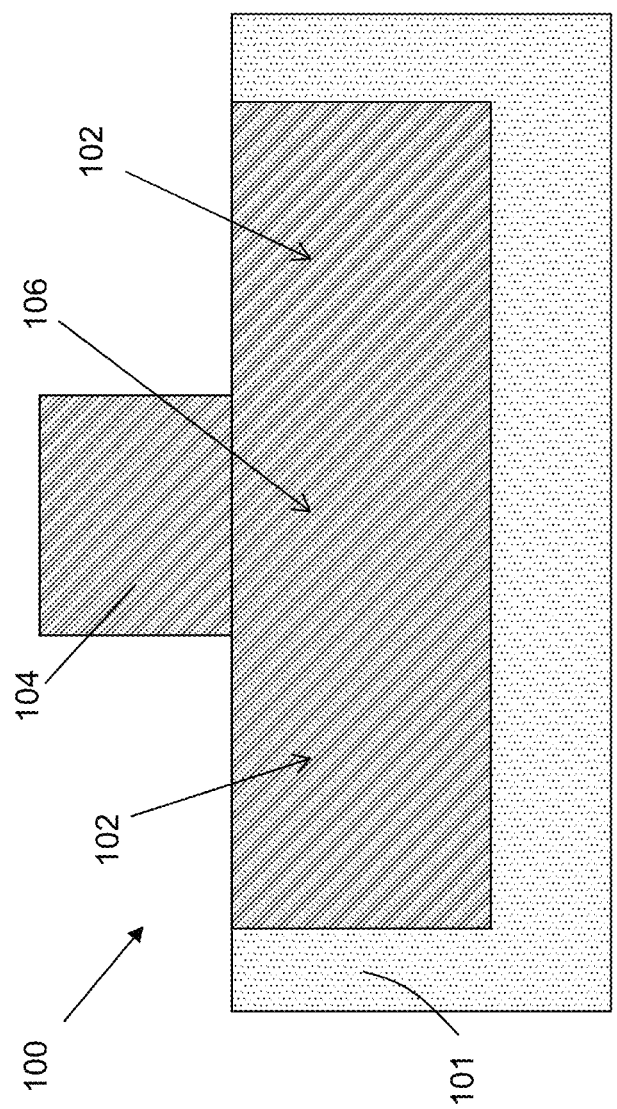
FIGS. 1-8 show a method for enhancing channel resistance by increasing strain in a device according to an embodiment of this invention.

Turning to FIG. 1, a device 100 is provided on a substrate of an integrated circuit chip 101 (partially shown). In this example, device 100 comprises an n-type field effect transistor (NFET) complementary metal-oxide-semiconductor (CMOS) device, but it is understood that the method disclosed herein can be applied to other devices in which a stress or strain is desired. As shown in FIG. 1, NFET 100 has source/drain (S/D) regions 102 adjacent to a gate region 104. NFET 100 further includes a channel region 106 between the S/D regions 102. It is understood that NFET 100 includes other features and regions as known in the art, which are not discussed or shown herein because they are not necessary for illustrating the embodiments of this invention.

Figure 2:
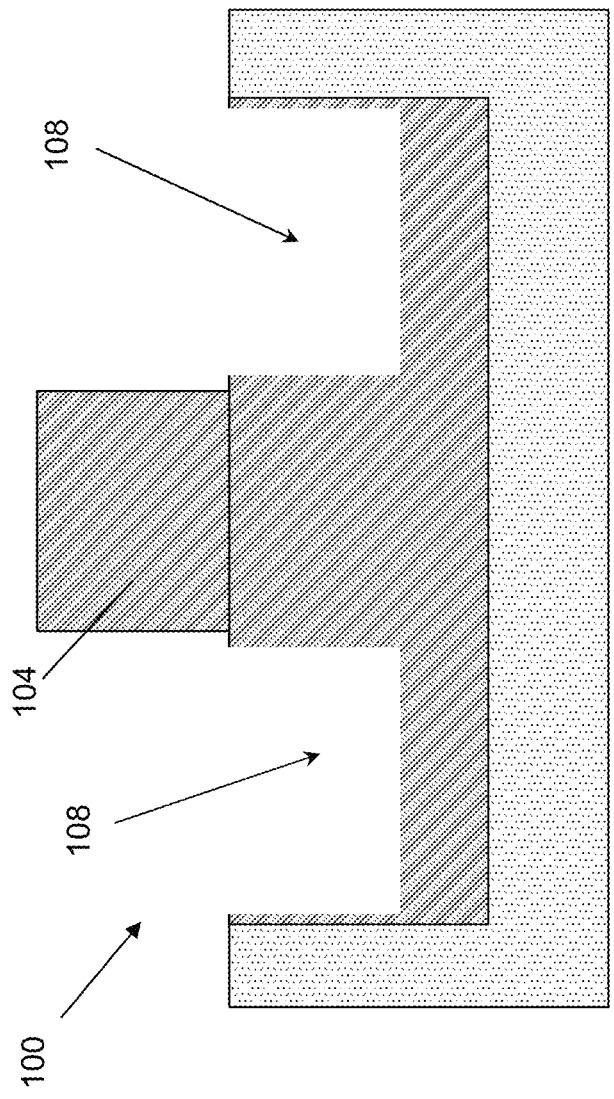

As shown in FIG. 2, one or more recesses 108 are formed in S/D regions 102 (FIG. 1). FIG. 2 shows a recess 108 formed in both S/D regions 102 (FIG. 1), but it is understood that a recess (and the subsequent steps described herein) can be formed in one or more S/D regions 102, as desired. As understood by one of ordinary skill in the art, recesses 108 can be formed via reactive ion etching (RIE), or any now known or later developed etching process. Depth of recesses 108 can be as desired, with a deeper depth resulting in a deeper stress, as long as recesses 108 are deep enough for subsequent layers (discussed herein) but not deep enough to go completely through NFET 100 to substrate 101. In one embodiment, recesses 108 can have a depth of approximately 30 nm to approximately 100 nm.

Figure 3:
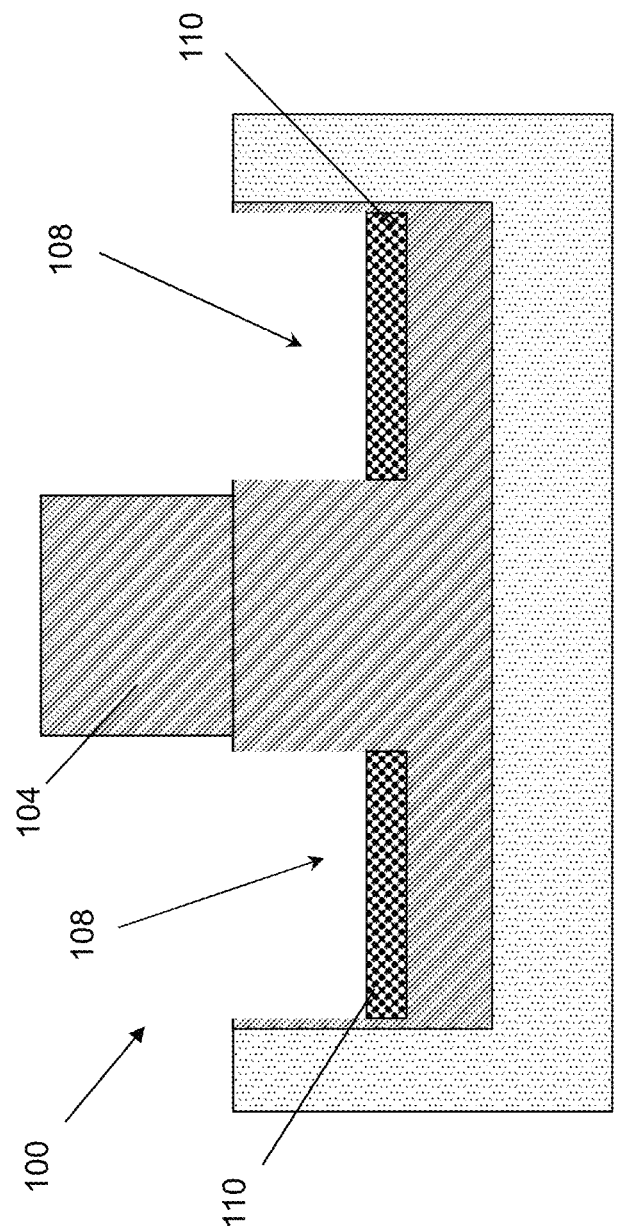

Turning to FIG. 3, an optional lower epitaxial layer 110 is epitaxially grown in recesses 108. Lower epitaxial layer 110 can include an n-type dopant, such as phosphorus (P), antimony (Sb) or arsenic (As), and can have inherent tensile stress, for example, because of carbon atoms grown into the layer. For example, lower epitaxial layer 110 can comprise silicon carbon phosphorous (SiCP). Lower epitaxial layer 110 can have a thickness as desired, for example, lower epitaxial layer 110 can have a thickness of approximately 20 to approximately 50 nm.

Figure 4:
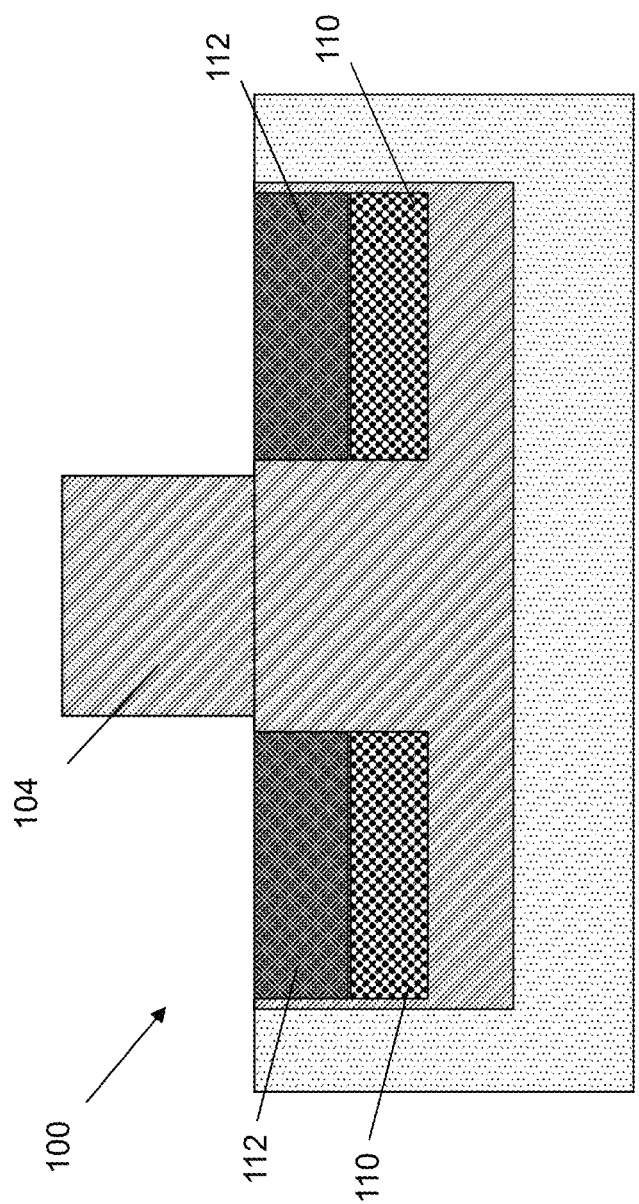

Turning to FIG. 4, an upper epitaxial layer 112 is epitaxially grown over lower epitaxial layer 110. Upper epitaxial layer can also include an n-type dopant, such as phosphorous (P), antimony (Sb) or arsenic (As), but in contrast to lower epitaxial layer 110, upper epitaxial layer 112 does not contain carbon. For example, upper epitaxial layer 112 can comprise phosphorous (P) doped silicon (Si). Upper epitaxial layer 112 can also have a thickness as desired, for example, upper epitaxial layer 112 can have a thickness of approximately 20 to approximately 80 nm.

Figure 5:
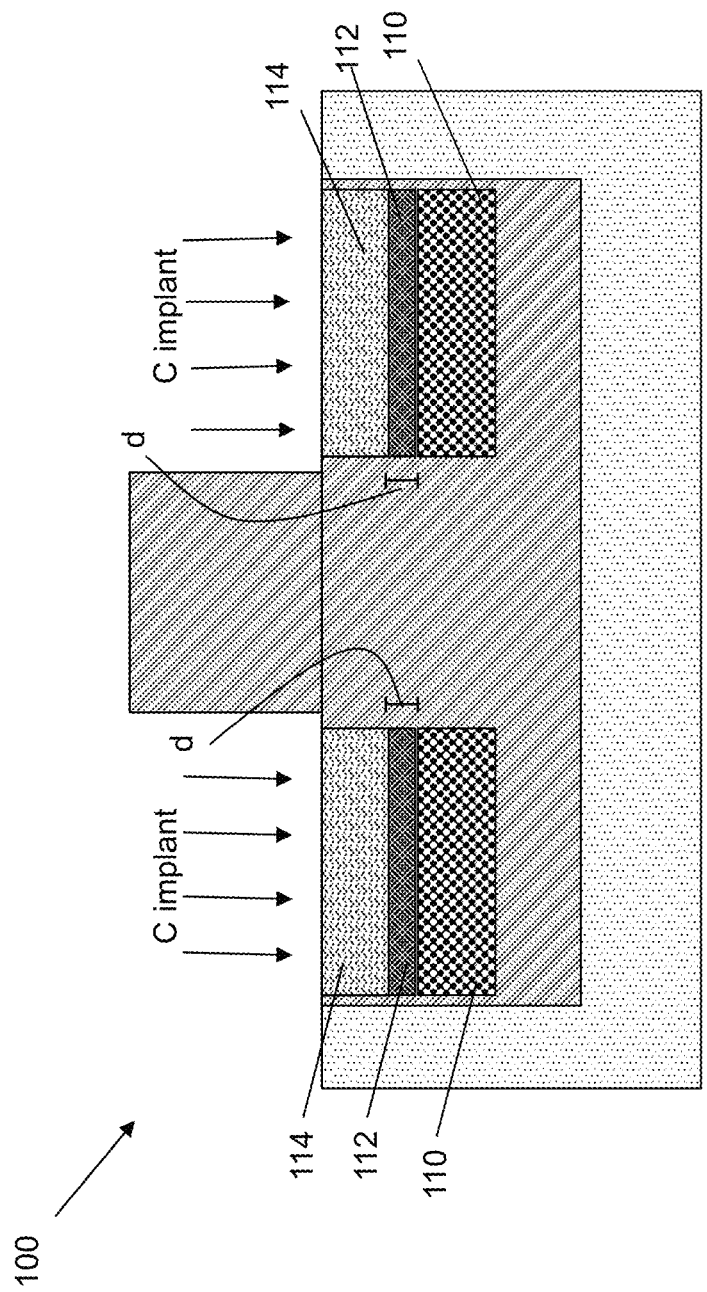

Turning to FIG. 5, a pre-amorphization implant (PAI) is performed to form an amorphous layer 114 in at least a portion of upper epitaxial layer 112. As shown in FIG. 5, the pre-amorphization implant introduces carbon into layer 112 to form layer 114. This pre-amorphization implant, illustrated by the arrows C in FIG. 5, can comprise a cold carbon implant or a cluster carbon implant. This implantation of carbon will amorphize a portion of upper epitaxial layer 112. "Amorphize" in this context means that the crystalline structure, or lattice, in the portion of layer 112 that receives the carbon atoms from the implant will be destroyed. Therefore, that portion of layer 112 will be amorphous, not crystalline. As discussed in more detail herein, this cold carbon (or cluster carbon) implant provides amorphization based on carbon, and this implanted carbon will be used in subsequent steps to assist in creating the enhanced stress desired.

The pre-amorphization implant is controlled such that the carbon is implanted only as deep as upper epitaxial layer 112, so as not to disturb lower epitaxial layer 110. In one embodiment, the implant is controlled so only an upper portion of upper epitaxial layer 112 is implanted, such that a lower portion of upper epitaxial layer 112 is not amorphized. For example, lower epitaxial layer 110 and amorphous layer 114 can be separated by enough distance, d, such that any subsequent implant which could cause stress loss does not penetrate lower epitaxial layer 110. In one embodiment, this distance, d, shown in FIG. 5 can be a portion of upper epitaxial layer 112 that is approximately 5 nm thick.

Figure 6:
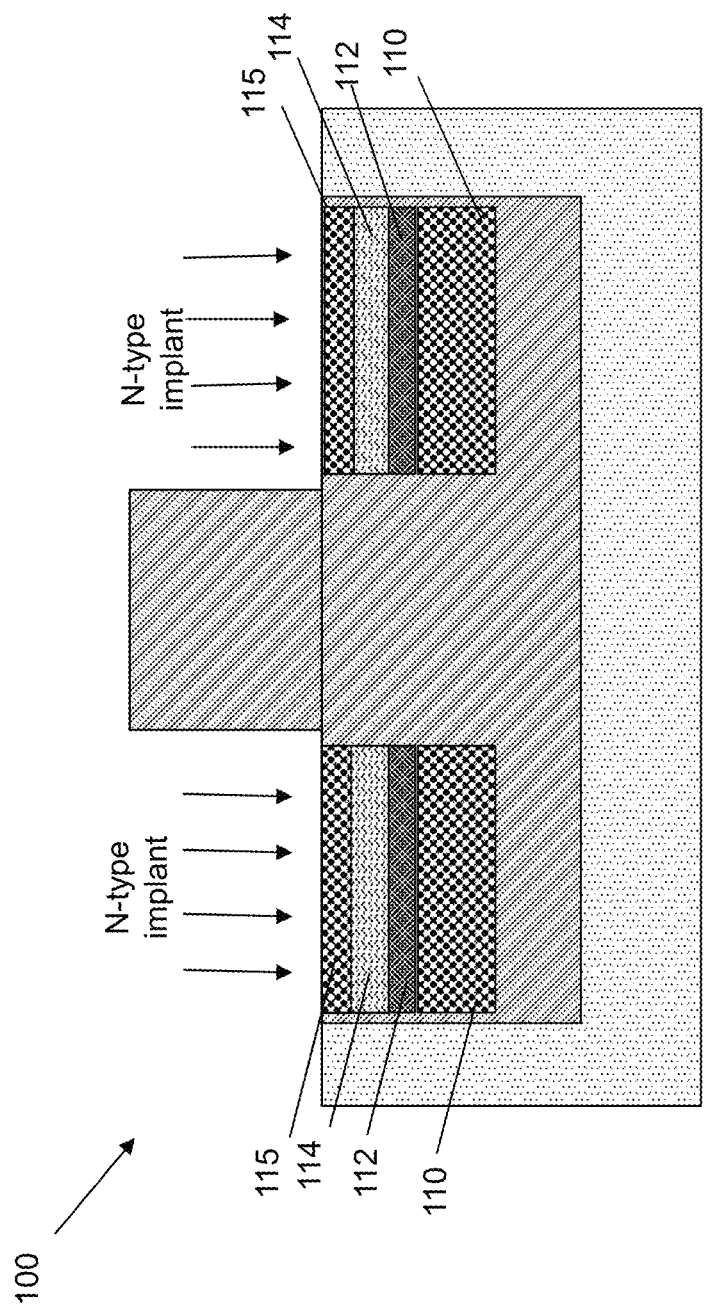

Turning to FIG. 6, an optional step is shown. In this step, an n-type dopant is implanted into amorphous layer 114 to form a further n-type doped amorphous layer 115. For example, the n-type dopant can comprise phosphorus (P), antimony (Sb) or arsenic (As). The nature of amorphous layer 114 acts to prevent these further dopants from penetrating beyond amorphous layer 114. With the additional n-type dopant implanted in this step, further n-type doped amorphous layer 115 can comprise silicon phosphorus with carbon, plus the antimony, arsenic or additional phosphorus that has been implanted. FIG. 6 shows implanting n-type dopants such that only an upper portion of amorphous layer 114 will become further n-type doped layer 115, but it is understood that layer 115 could be thicker or thinner as desired. As is known in the art, adding more n-type dopants increases the number of electrons that participate in electrical conduction, and therefore will act to reduce resistance. Therefore, this additional doping of n-type dopants in layer 114 will act to lower resistance in source/drain regions of n-type doped layer 115.

Figure 7:
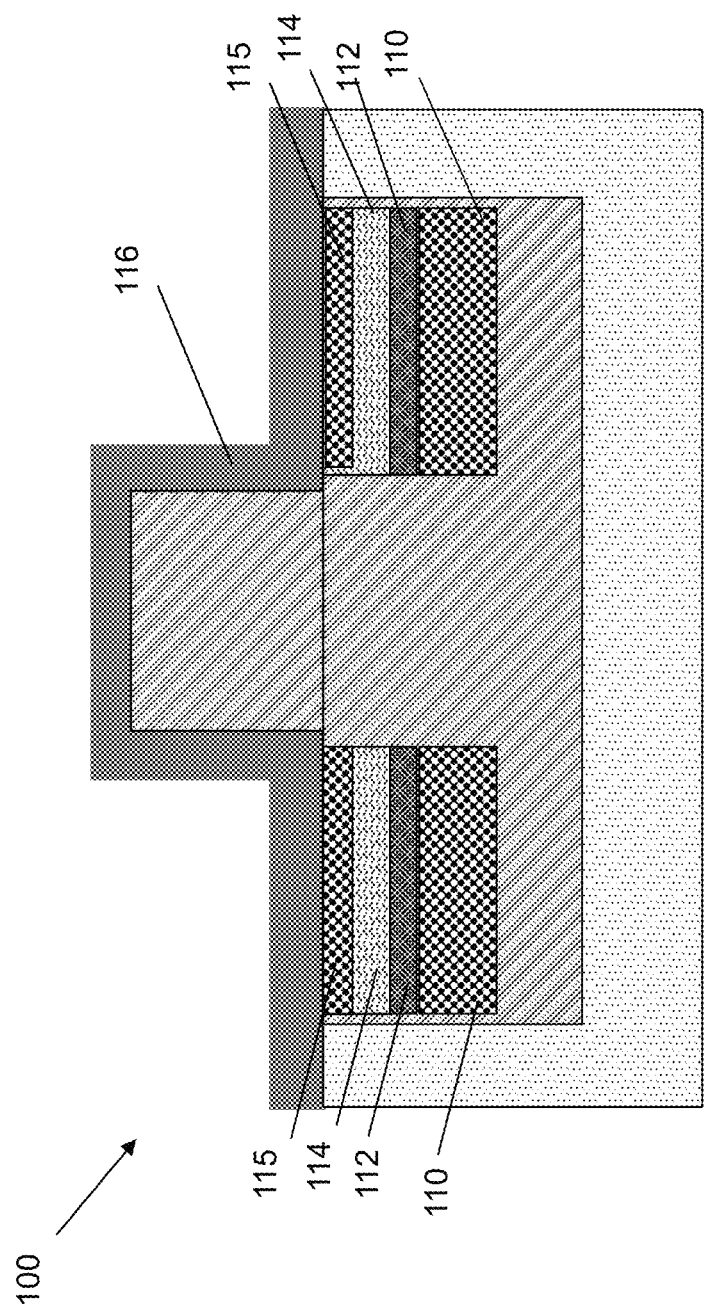

FIG. 7 shows the next step in the method, regardless of whether the additional n-type dopants shown in FIG. 6 are implanted. In FIG. 7, a tensile cap 116 is formed over amorphous layer 114 to enable a stress memorization technique (SMT). In one embodiment, tensile cap 116 comprises a nitride layer, such as silicon nitride (SiN) or titanium nitride (TiN).

Figure 8:
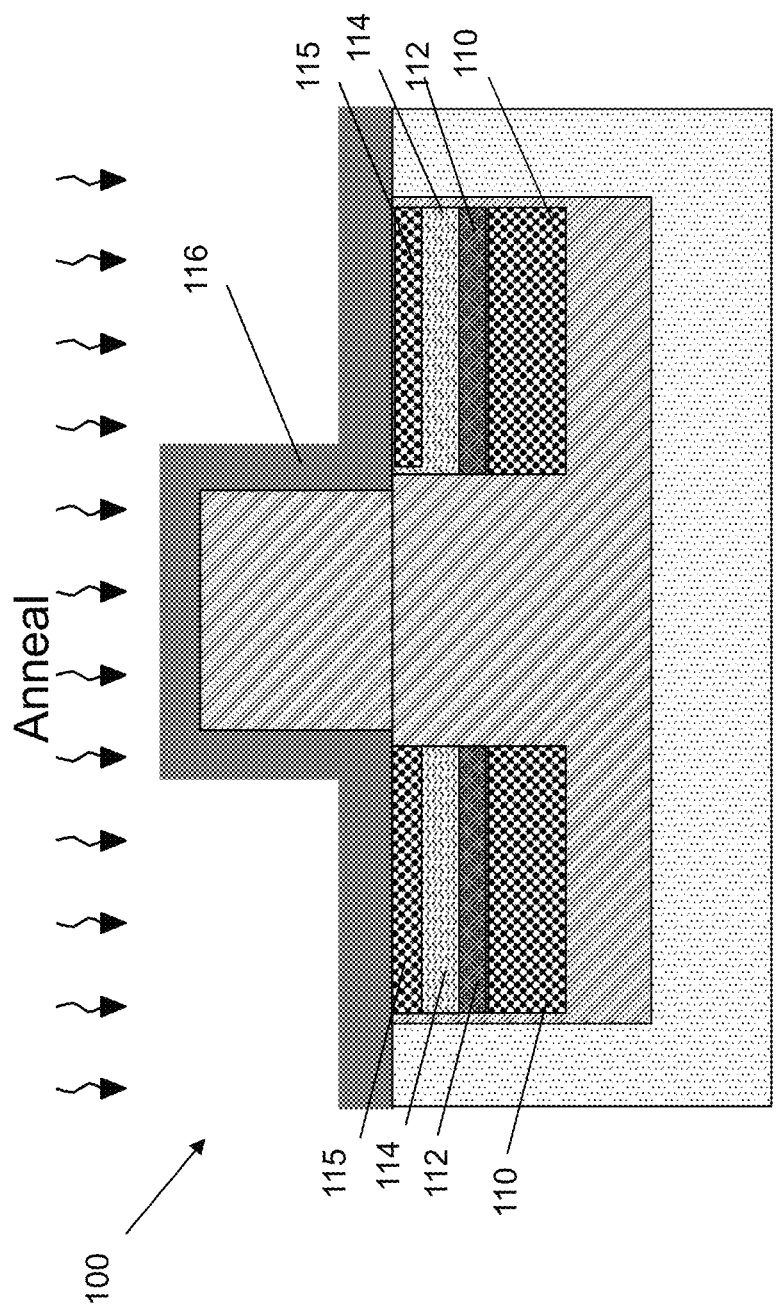
Figure 9:
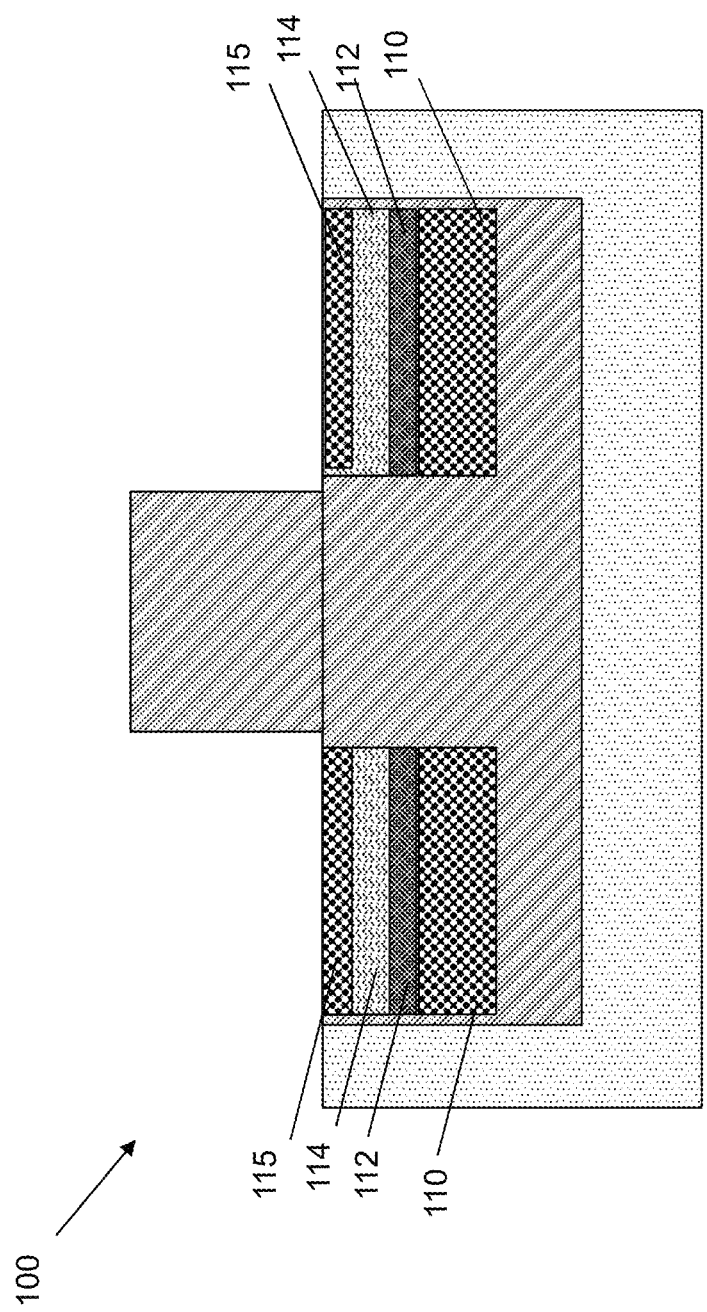
FIG. 9 shows a device with increased strain according to an embodiment of this invention.

Next, as shown in FIG. 8, an SMT effect is created by performing an anneal which will re-crystallize amorphous layer 114 (which may or may not include further n-type doped layer 115 as discussed in connection with FIG. 6). Therefore, after the anneal, amorphous layer 114 is no longer amorphous, but becomes re-crystallized. In addition to re-crystallizing layer 114, this step also functions to move the carbon atoms that were implanted during the cold carbon (or cluster carbon) implant (FIG. 5) into substitutional positions.

The annealing of amorphous layer 114 with nitride cap 116 "memorizes" the stress in layer 114. As known by one of skill in the art, the term "memorizes" in this context means that after cooling down the device, there is still a stress present in the layer. In this context, memorization means that once cap 116 is removed, the stress remains in layer 114. In other words, the recrystallization that occurs due to the annealing means that atoms in amorphous layer 114 have moved and are in positions such that NFET 100 remains under tensile stress, even after cap 116 is removed. This effect is called SMT. The annealing can be performed by any anneal that creates a solid phase epitaxy (SPE), including, but not limited to a rapid thermal anneal (RTA) or a millisecond anneal (for example, a laser anneal (LSA), a dynamic surface anneal (DSA), or a flash anneal (FLA)).

FIG. 9 shows the resulting NFET 100 when tensile cap 116 has been removed. As shown in FIG. 9, NFET 100 according to embodiments of this invention includes lower n-type doped layer 110 in a S/D region 102 (FIG. 1), having inherent tensile stress due to the presence of carbon in layer 110. As discussed herein, lower n-type doped layer 110 can comprise a crystalline silicon carbon phosphorous (SiCP). NFET 100 further includes an upper n-type doped layer 114, over lower n-type doped layer 110. Upper n-type doped layer 114 is also crystallized, due to the annealing discussed in connection with FIG. 8. Optional layer 115 is shown in FIG. 9, where an n-type dopant has been implanted into amorphous layer 114 to form a further n-type doped amorphous layer 115. Also, because of the cold carbon or carbon cluster pre-amorphization implant (PAI), discussed in connection with FIG. 5, layers 114, 115 include substitutional carbon. Therefore, after the annealing with nitride cap 116 to memorize the stress, i.e., a tensile stress induced by a stress memorization technique (SMT), layers 114, 115 have a stress that is higher than what would be produced by the presence of carbon alone. This additional stress is memorized by SMT and causes higher mobility in channel 106 (FIG. 1) of NFET 100 due to the fact that electron mobility is enhanced by the tensile stress levels. Therefore, the method according to an embodiment of this invention includes the presence of substitutional carbon under SMT stress (stress generated via a memorization technique) in layers 114, 115.

Figure 15:
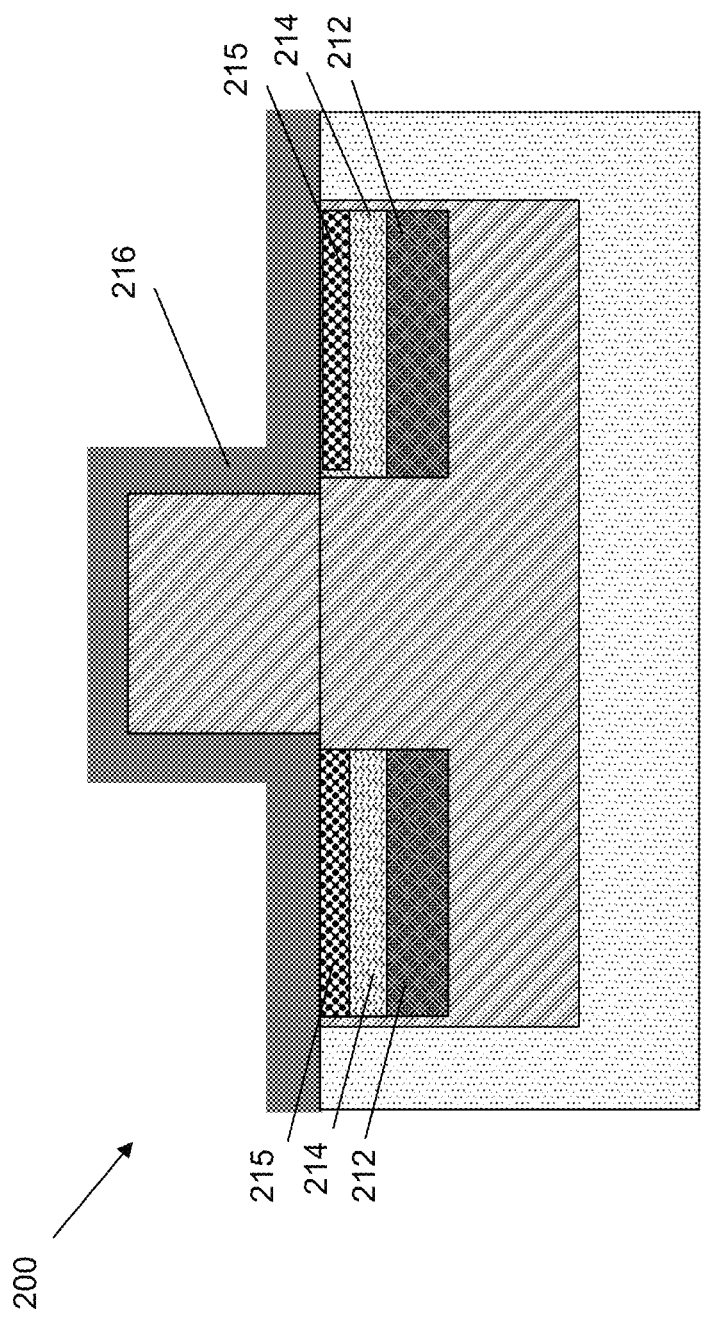
Figure 16:
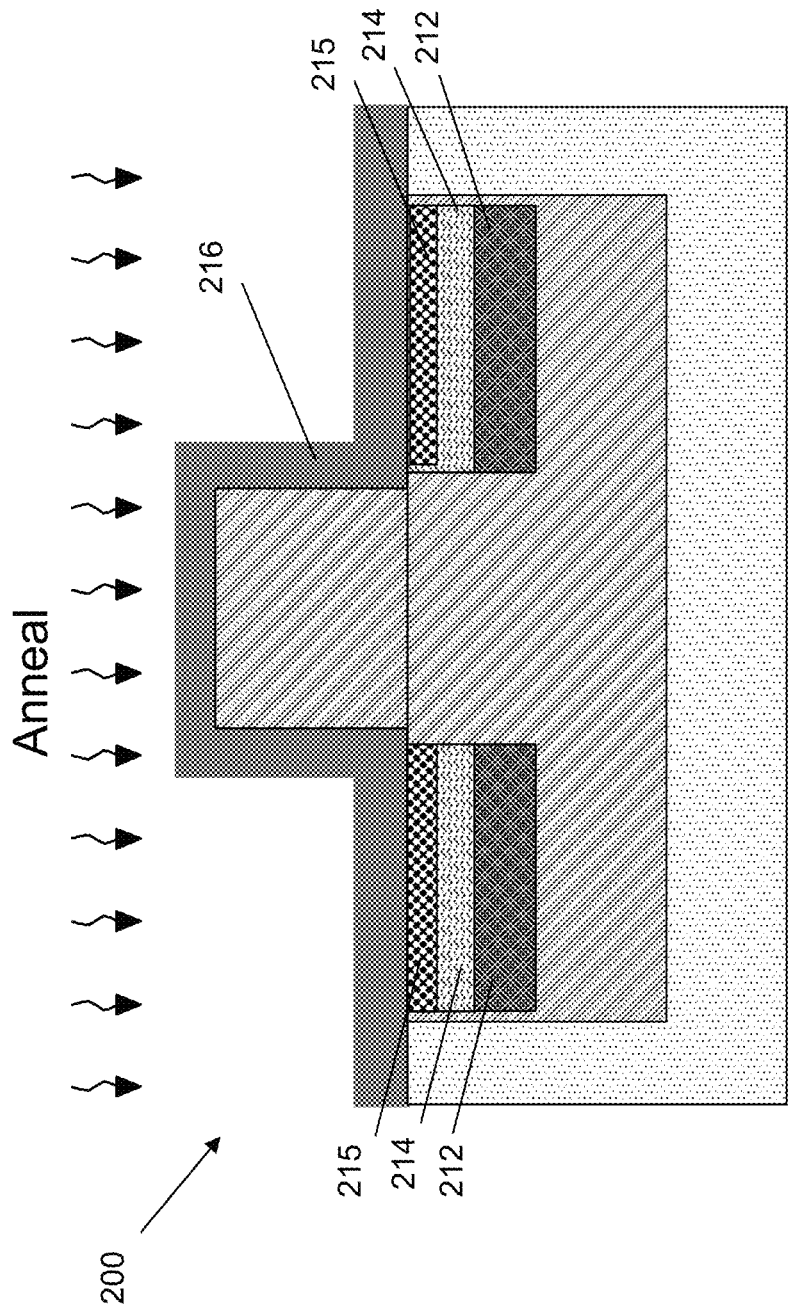
Figure 17:
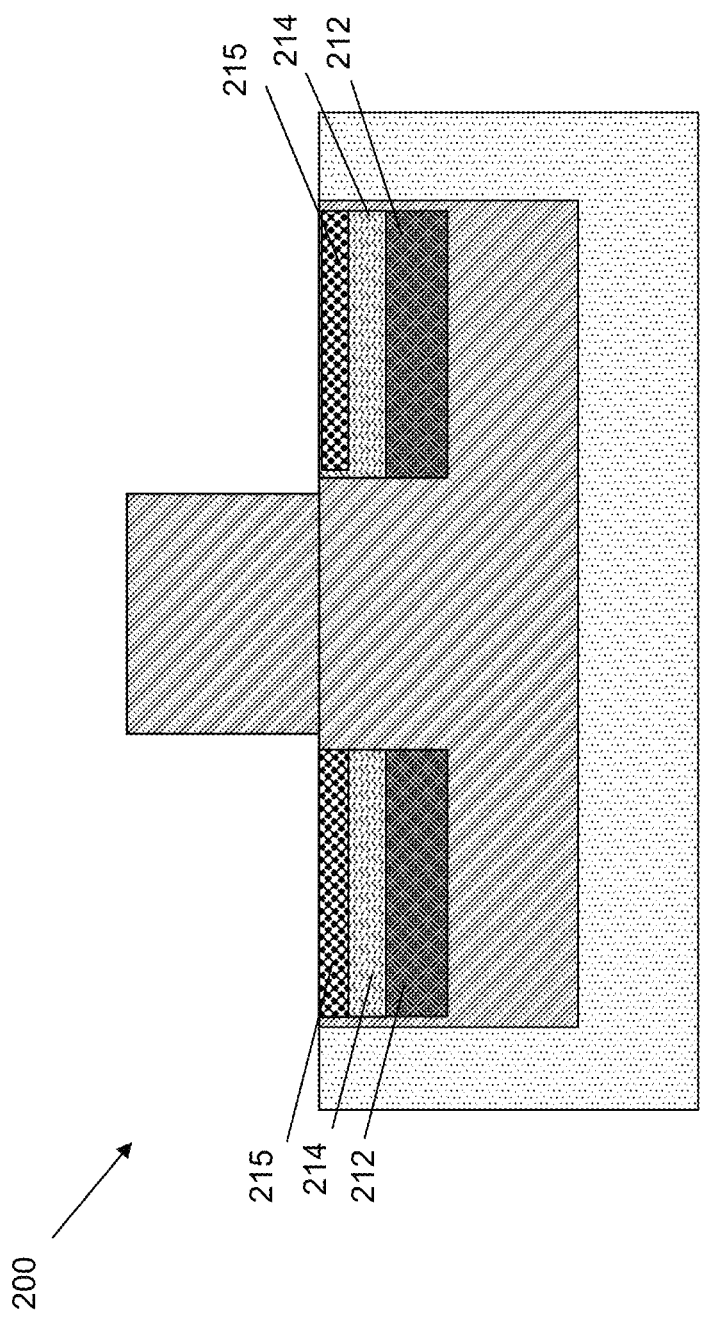
FIG. 17 shows a device with increased strain according to another embodiment of this invention.

Turning to FIGS. 10-17, a method according to another embodiment of this invention is shown in FIGS. 10-16, with FIG. 17 showing the final device structure according to this embodiment. The embodiment shown in FIGS. 10-17 is similar to the embodiment shown in FIGS. 1-9, except that this embodiment includes only one epitaxial layer, i.e., epitaxial layer 212.

Figure 10:
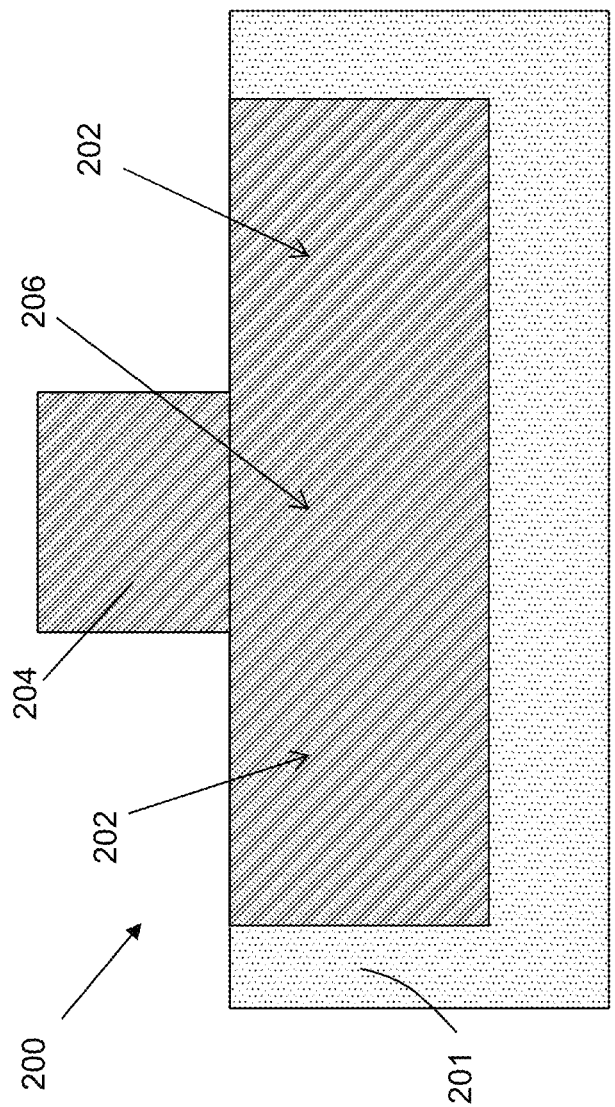
FIGS. 10-16 show a method for enhancing channel resistance by increasing strain in a device according to another embodiment of this invention.

As shown in FIG. 10, a device 200 is provided on a substrate of an integrated circuit chip 201 (partially shown). In this example, device 200 comprises an NFET CMOS device, but it is understood that the method disclosed herein can be applied to other devices in which a stress or strain is desired. As shown in FIG. 10, NFET 200 has source/drain (S/D) regions 202 adjacent to a gate region 204. NFET 200 further includes a channel region 206 between the S/D regions 202. It is understood that NFET 200 includes other features and regions as known in the art, which are not discussed or shown herein because they are not necessary for illustrating the embodiments of this invention.

Figure 11:
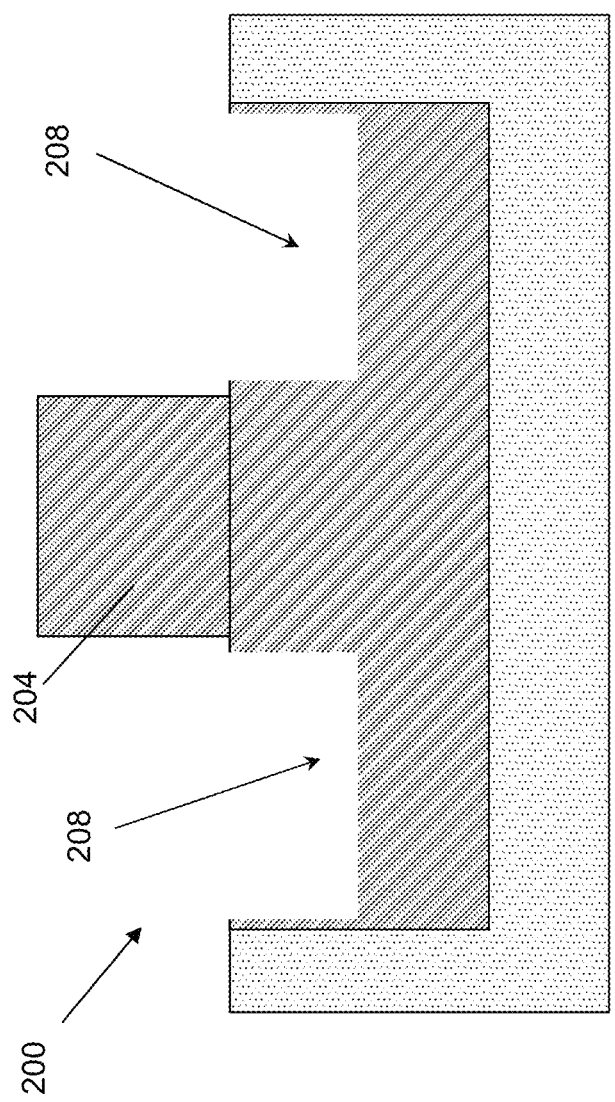

As shown in FIG. 11, one or more recesses 208 are formed in S/D regions 202 (FIG. 10). FIG. 11 shows a recess 208 formed in both S/D regions 202 (FIG. 10), but it is understood that a recess (and the subsequent steps described herein) can be formed in one or more S/D regions 202, as desired. As understood by one of ordinary skill in the art, recesses 208 can be formed via reactive ion etching (RIE), or any now known or later developed etching process. Depth of recesses 208 can be as desired, with a deeper depth resulting in a deeper stress, as long as recesses 208 are deep enough for subsequent layers (discussed herein) but not deep enough to go completely through NFET 200 to substrate 201. In one embodiment, recesses 208 can have a depth of approximately 30 nm to approximately 100 nm.

Figure 12:
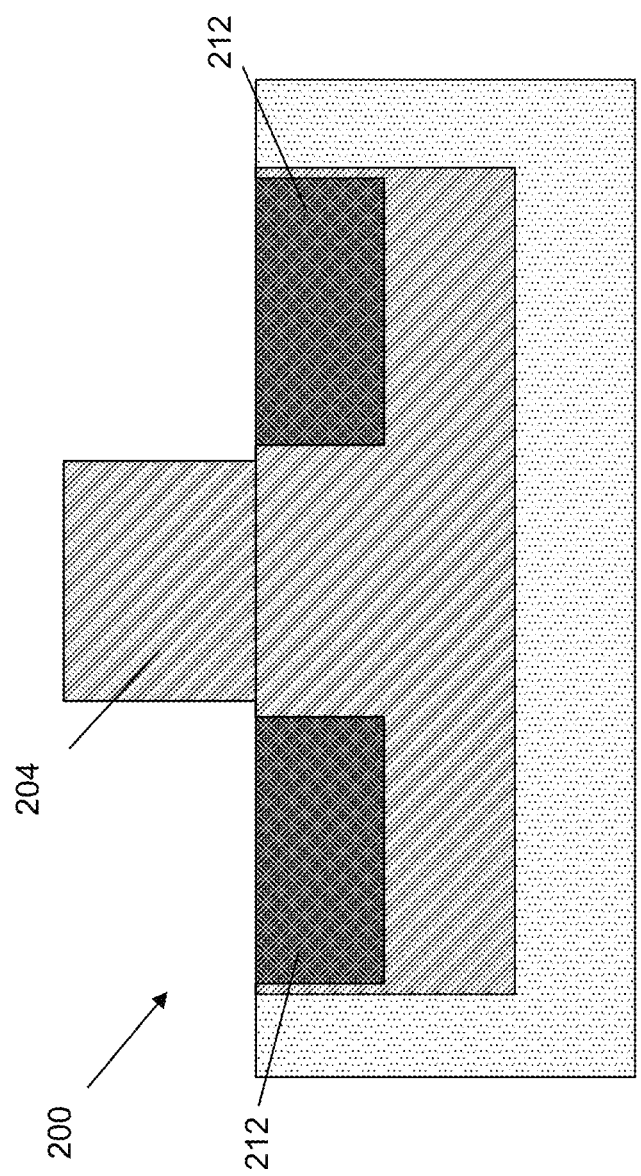

Turning to FIG. 12, an epitaxial layer 212 is epitaxially grown in at least one recess 208. Epitaxial layer 212 can also include an n-type dopant, such as phosphorous (P), antimony (Sb) or arsenic (As), but does not contain carbon. For example, epitaxial layer 212 can comprise phosphorous (P) doped silicon (Si). Epitaxial layer 212 can also have a thickness as desired, for example, epitaxial layer 212 can have a thickness of approximately 20 to approximately 80 nm.

Figure 13:
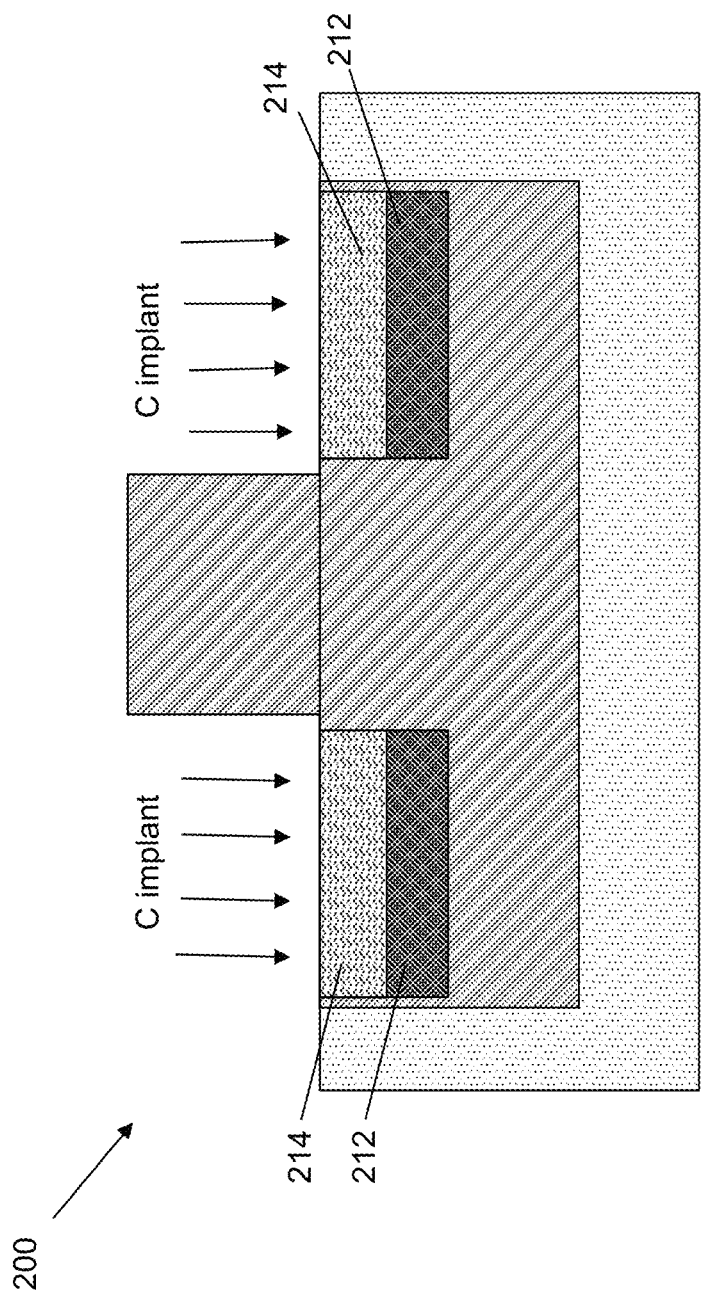

Turning to FIG. 13, a pre-amorphization implant (PAI) is performed to form an amorphous layer 214 in at least a portion of epitaxial layer 212. As shown in FIG. 13, the pre-amorphization implant introduces carbon into layer 212 to form layer 214. This pre-amorphization implant, illustrated by the arrows C in FIG. 13, can comprise a cold carbon implant or a cluster carbon implant. This implantation of carbon will amorphize a portion of epitaxial layer 212. "Amorphize" in this context means that the crystalline structure, or lattice, in the portion of layer 212 that receives the carbon atoms from the implant will be destroyed. Therefore, that portion of layer 212 will be amorphous, not crystalline. As discussed in more detail herein, this cold carbon (or cluster carbon) implant provides amorphization based on carbon, and this implanted carbon will be used in subsequent steps to assist in creating the enhanced stress desired.

The pre-amorphization implant is controlled such that the carbon is implanted only as deep as desired in epitaxial layer 212. In one embodiment, the implant is controlled so only an upper portion of epitaxial layer 212 is implanted as shown in FIG. 13, such that a lower portion of epitaxial layer 212 is not amorphized, but it is understood that the entire epitaxial layer 212 can be amorphized if desired.

Figure 14:
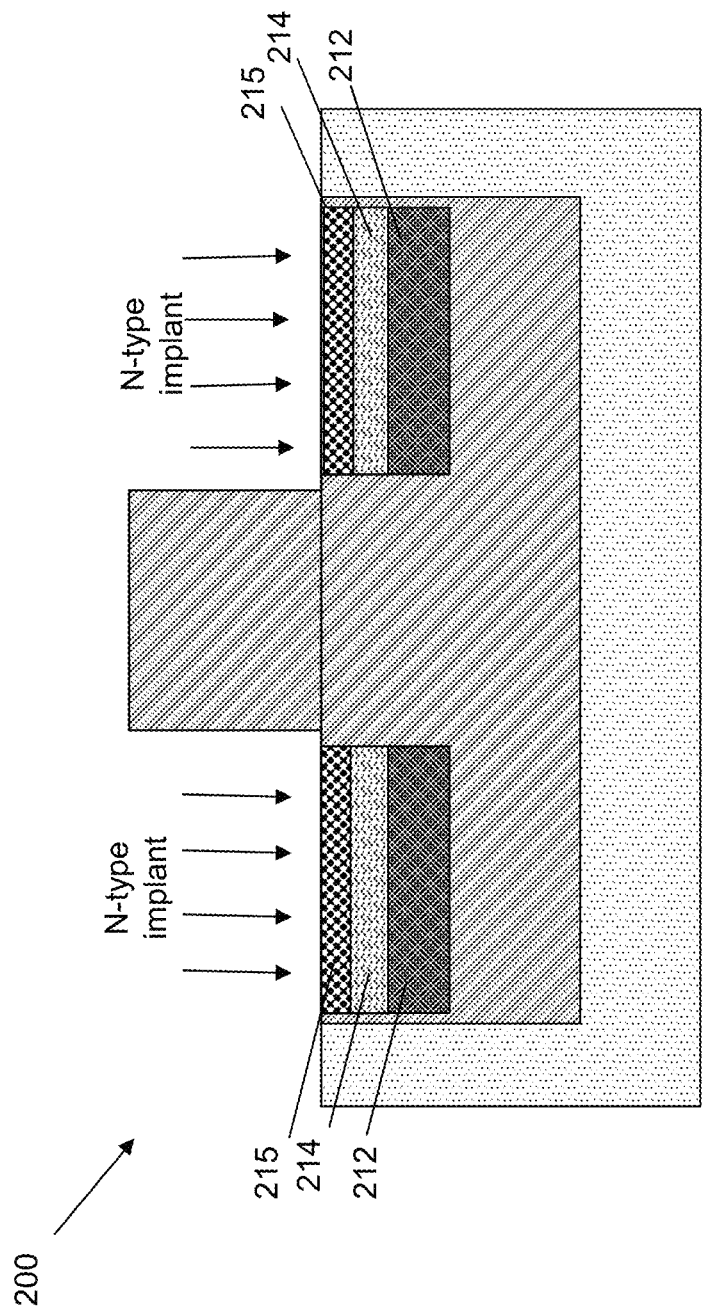

Turning to FIG. 14, an optional step is shown. In this step, an n-type dopant is implanted into amorphous layer 214 to form a further n-type doped amorphous layer 215. For example, the n-type dopant can comprise phosphorus (P), antimony (Sb) or arsenic (As). The nature of amorphous layer 214 acts to prevent these further dopants from penetrating beyond amorphous layer 214. With the additional n-type dopant implanted in this step, further n-type doped amorphous layer 215 can comprise silicon phosphorus with carbon, plus the antimony, arsenic or additional phosphorous that were implanted. FIG. 14 shows implanting n-type dopants such that only an upper portion of amorphous layer 214 will become further n-type doped layer 215, but it is understood that layer 215 could be thicker or thinner as desired. As is known in the art, adding more n-type dopants increases the number of electrons that participate in electrical conduction, and therefore will act to reduce resistance. Therefore, this additional doping of n-type dopants in layer 214 will act to lower resistance in source/drain regions of n-type doped layer 215.

FIG. 15 shows the next step in the method, regardless of whether the additional n-type dopants shown in FIG. 14 are implanted. In FIG. 15, a tensile cap 216 is formed over amorphous layer 214 to enable a stress memorization technique (SMT). In one embodiment, tensile cap 216 comprises a nitride layer, such as silicon nitride (SiN) or titanium nitride (TiN).

Next, as shown in FIG. 16, an SMT effect is created by performing an anneal which will re-crystallize amorphous layer 214 (which may or may not include further n-type doped layer 215 as discussed in connection with FIG. 14). Therefore, after the anneal, amorphous layer 214 is no longer amorphous, but becomes re-crystallized. In addition to re-crystallizing layer 214, this step also functions to move the carbon atoms that were implanted during the cold carbon (or cluster carbon) implant (FIG. 13) into substitutional positions.

FIG. 17 shows the resulting NFET 200 when tensile cap 216 has been removed. As shown in FIG. 17, NFET 200 according to embodiments of this invention includes an n-type doped layer 214 in a S/D region 202 (FIG. 1), with n-type doped layer 214 being crystallized, due to the annealing discussed in connection with FIG. 16. Optional layer 215 is shown in FIG. 17, where an n-type dopant has been implanted into amorphous layer 214 to form a further n-type doped amorphous layer 215. Also, because of the cold carbon or carbon cluster pre-amorphization implant (PAI), discussed in connection with FIG. 13, layers 214, 215 include substitutional carbon. Therefore, after the annealing with nitride cap 216 to memorize the stress, i.e., a tensile stress induced by a stress memorization technique (SMT), layers 214, 215 have a stress that is higher than what would be produced by the presence of carbon alone. This additional stress is memorized by SMT and causes higher mobility in channel 206 (FIG. 10) of NFET 200 due to the fact that electron mobility is enhanced by the tensile stress levels. Therefore, the method according to an embodiment of this invention includes the presence of substitutional carbon under SMT stress (stress generated via a memorization technique) in layers 214, 215.

With regard to the epitaxial layers discussed herein, i.e., lower epitaxial layer 110 (FIG. 3), upper epitaxial layer 112 (FIG. 4) and epitaxial layer 212 (FIG. 12), it is understood that an epitaxial substrate suitable for growing layers 110, 112, 212 should be present in the area in which an epitaxial layer is desired to be grown. A suitable epitaxial substrate is a substrate that is crystalline in structure. In one embodiment, the epitaxial substrate can be silicon (Si) or silicon germanium (SiGe). It is also understood that a silicon on insulator (SOI) substrate can also be used. For example, a dielectric layer (not shown) can be included under a silicon layer, this dielectric (insulator) layer, such as an oxide, serves to isolate the structure above from the silicon underneath. Therefore, in another embodiment, silicon on oxide can be used as the epitaxial substrate.

As discussed herein, in prior art methods, the amorphization step required to enable substitutional carbon by solid phase epitaxy (SPE) is incompatible with a SMT present in the transistor (i.e., stress present in the layer is eliminated when the amorphization step is performed). Similarly, in prior art methods, the amorphization required to enable SMT on a material with high concentration of substitutional carbon causes the irreversible displacement of substitutional carbon, and therefore a loss of the stress associated with substitutional carbon. In contrast, in the method and structure according to embodiments of this invention, the pre-amorphization step is used to enable carbon based SPE, but is also used to create the preconditions for SMT. Specifically, the amorphization is done such that the recrystallization also functions to move carbon atoms into substitutional positions and then the SMT can memorize the stress in NFET 100, 200. In this way, embodiments of this invention provide a way to make the effects of SMT and carbon based SPE additive, i.e., achieving even higher stress than if each method were performed separately. This is possible, in part, because a cold carbon (or cluster carbon) implant was performed that provided amorphization based on carbon, in contrast to prior amorphization processes that typically use heavy atoms like arsenic (As), xenon (Xe) or germanium (Ge).

The methods and structure as described above are used in the fabrication of semiconductor chips. The resulting semiconductor chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The foregoing drawings show some of the processing associated according to several embodiments of this disclosure. In this regard, each drawing or block within a flow diagram of the drawings represents a process associated with embodiments of the method described. It should also be noted that in some alternative implementations, the acts noted in the drawings or blocks may occur out of the order noted in the figure or, for example, may in fact be executed substantially concurrently or in the reverse order, depending upon the act involved. Also, one of ordinary skill in the art will recognize that additional blocks that describe the processing may be added.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. An n-type field effect transistor (NFET) complementary metal-oxide-semiconductor (CMOS) device having a source region and a drain region, the NFET CMOS comprising:
 an n-type doped layer in at least one of the source region and the drain region, wherein the n-type doped layer includes a lower portion and an upper portion, wherein the lower portion includes substitutional carbon and has a memorized tensile stress induced by a stress memorization technique (SMT), and wherein the upper portion includes an implantation layer including silicon carbon phosphorus (SiCP) with an additional n-type dopant; and a lower n-type doped layer, positioned under the n-typed doped layer, wherein the lower n-type doped layer comprises crystalline silicon carbon phosphorous (SiCP), wherein the lower n-type doped layer and the lower portion of the n-type doped layer are separated by an intermediate layer, wherein the intermediate layer comprises n-type doped silicon (Si), and wherein the intermediate layer has a thickness of approximately 5 nm.

2. The NFET CMOS of claim 1, wherein the additional n-type dopant comprises a dopant selected from the group consisting of: phosphorus (P), antimony (Sb) and arsenic (As).

3. The NFET CMOS of claim 1, wherein the lower n-type doped layer and the n-type doped layer both have a thickness of approximately 20 to approximately 50 nm.

4. An n-type field effect transistor (NFET) complementary metal-oxide-semiconductor (CMOS) device having a source region and a drain region, the NFET CMOS comprising:

an n-type doped layer in at least one of the source region and the drain region, wherein the n-type doped layer includes a lower portion and an upper portion, wherein the lower portion includes substitutional carbon and has a memorized tensile stress induced by a stress memorization technique (SMT), and wherein the upper portion includes an implantation layer including silicon carbon phosphorous (SiCP) with an additional n-type dopant; and a lower n-type doped layer, positioned under the n-typed doped layer, wherein the lower n-type doped layer comprises crystalline silicon carbon phosphorous (SiCP), wherein the lower n-type doped layer and the lower portion of the n-type doped layer both have a thickness of approximately 20 to approximately 50 nm.

5. The NFET CMOS of claim 4, wherein the lower n-type doped layer and the n-type doped layer are separated by an intermediate layer, wherein the intermediate layer comprises n-type doped silicon (Si).

6. The NFET CMOS of claim 5, wherein the intermediate layer has a thickness of approximately 5 nm.

7. The NFET CMOS of claim 4, wherein the additional n-type dopant comprises a dopant selected from the group consisting of: phosphorus (P), antimony (Sb) and arsenic (As).

8. An n-type field effect transistor (NFET) complementary metal-oxide-semiconductor (CMOS) device having a source region and a drain region, the NFET CMOS comprising:

an n-type doped layer in at least one of the source region and the drain region, wherein the n-type doped layer includes a lower portion and an upper portion, wherein the lower portion includes substitutional carbon and has a memorized tensile stress induced by a stress memorization technique (SMT), and wherein the upper portion includes an implantation layer within the n-type doped layer, wherein the implantation layer comprises silicon carbon phosphorous (SiCP) with an additional n-type dopant, wherein the additional n-type dopant comprises a dopant selected from the group consisting of: phosphorus (P), antimony (Sb) and arsenic (As); and a lower n-type doped layer, positioned under the n-typed doped layer, wherein the lower n-type doped layer comprises crystalline silicon carbon phosphorous (SiCP), wherein the lower n-type doped layer and the lower portion of the n-type doped layer are separated by an intermediate layer, wherein the intermediate layer comprises n-type doped silicon (Si).

9. The NFET CMOS of claim 8, wherein the intermediate layer has a thickness of approximately 5 nm.

10. The NFET CMOS of claim 8, wherein the lower n-type doped layer and the n-type doped layer both have a thickness of approximately 20 to approximately 50 nm.

* * * * *